(12) United States Patent
Chen et al.

(10) Patent No.: US 9,585,272 B2
(45) Date of Patent: Feb. 28, 2017

(54) STORAGE DEVICE

(71) Applicant: PHISON ELECTRONICS CORP., Miaoli (TW)

(72) Inventors: Chang-Chih Chen, Hsinchu County (TW); Hung-I Chung, Hsinchu County (TW)

(73) Assignee: PHISON ELECTRONICS CORP., Miaoli (TW)

( * ) Notice: Subject to any disclaimer, the term of this patent is extended or adjusted under 35 U.S.C. 154(b) by 172 days.

(21) Appl. No.: 13/831,973

(22) Filed: Mar. 15, 2013

(65) Prior Publication Data

US 2014/0204524 A1    Jul. 24, 2014

(30) Foreign Application Priority Data

Jan. 22, 2013    (TW) .............................. 102102393 A

(51) Int. Cl.
*H05K 5/02*    (2006.01)
*H01R 13/66*   (2006.01)

(52) U.S. Cl.
CPC ....... *H05K 5/0278* (2013.01); *H01R 13/6658* (2013.01)

(58) Field of Classification Search
CPC ...... H05K 5/0278; Y10S 439/951; G06F 1/16
See application file for complete search history.

(56) References Cited

U.S. PATENT DOCUMENTS

| 6,309,255 | B1 * | 10/2001 | Yu ................................. | 439/660 |
| 7,359,208 | B2 * | 4/2008 | Ni ................................. | 361/752 |
| 7,540,786 | B1 * | 6/2009 | Koser et al. .................. | 439/660 |
| 7,748,995 | B1 * | 7/2010 | Lee .............................. | 439/76.1 |
| 8,043,101 | B2 * | 10/2011 | Zhang ............... | H01R 13/4538 |
|           |      |         |                                   | 439/133 |
| D660,858  | S  * | 5/2012 | Schlossstein ............. | D14/480.7 |
| 8,192,211 | B1 * | 6/2012 | Huang .......................... | 439/131 |

(Continued)

FOREIGN PATENT DOCUMENTS

CN           101562290        10/2009

OTHER PUBLICATIONS

"Office Action of China Counterpart Application", issued on Dec. 15, 2015, p. 1-p. 7.

*Primary Examiner* — Xanthia C Cunningham
(74) *Attorney, Agent, or Firm* — Jianq Chyun IP Office

(57) ABSTRACT

A storage device including a bearing member, a storage unit, and a casing is provided. The casing has a bottom plate, a top plate and a main assembling structure. The bearing member has an interfering portion and a sub-assembling structure. The storage unit has a body with a first surface and a second surface opposite to each other, a limiting portion and a terminal set. Parts of the terminal set and the limiting portion are located at the first surface. The storage unit and the interfering portion are accommodated in the casing. The interfering portion provides interfering force to the limiting portion, and the bottom plate provides a supporting force to the second surface, so that the storage unit is positioned in the casing. The main assembling structure and the sub-assembling are assembled detachably to each other to configure or detach the bearing member and the casing.

20 Claims, 11 Drawing Sheets

(56) References Cited

U.S. PATENT DOCUMENTS

| | | | |
|---|---|---|---|
| 8,500,466 B2* | 8/2013 | Zhang | H05K 5/0278 439/131 |
| 2005/0164532 A1* | 7/2005 | Ni et al. | 439/79 |
| 2007/0076382 A1 | 4/2007 | Ni | |
| 2008/0232060 A1* | 9/2008 | Yu et al. | 361/684 |
| 2010/0091469 A1* | 4/2010 | Lin | 361/752 |
| 2010/0321878 A1* | 12/2010 | Huang | 361/679.31 |
| 2012/0052731 A1* | 3/2012 | Hsiao et al. | 439/620.22 |

* cited by examiner

STORAGE DEVICE

CROSS-REFERENCE TO RELATED APPLICATION

This application claims the priority benefit of Taiwan application serial no. 102102393, filed on Jan. 22, 2013. The entirety of the above-mentioned patent application is hereby incorporated by reference herein and made a part of this specification.

BACKGROUND

Technology Field

The present invention generally relates to a storage device.

Description of Related Art

With the developments of multimedia technology, storage capacity required for digital data goes larger and larger. Conventional floppy disk in 1.44 MB features in its portable characteristic but still fails to meet the requirement of large storage capacity. Although a conventional hard disk provides a large storage capacity, it still suffers in bulk size which leads to inconvenient carrying. Rewritable non-volatile memory has the characteristics of data non-volatility, low power consumption, compact size, and non-mechanical structure. Hence, rewritable non-volatile memory is adapted for portable appliances, especially portable products powered by batteries. A flash drive is a storage device adopting NAND flash memory as storage medium.

Generally, the flash drive includes a circuit board, electronic devices as well as a plurality of elastic terminals and metal conductive strips (also known as connectors or connecting interfaces) configured to connect a host. Although a size of the flash drive may be reduce by miniaturizing the circuit board, it is difficult to further miniaturize the size of the flash drive in regard to dimensions of the metal casing of the connectors.

For instance, with existing specification for connection and transmission has been upgraded from Universal Serial Bus, USB1.0/1.1 to Universal Serial Bus, USB2.0 and even further to Universal Serial Bus, USB3.0, thus additional pins are added accordingly. Therefore, a solution as how to reduce the size of the flash drive while maintaining structural strength of the flash drive has became one of the major subjects in the industry for person skilled in the art.

Nothing herein should be construed as an admission of knowledge in the prior art of any portion of the present invention. Furthermore, citation or identification of any document in this application is not an admission that such document is available as prior art to the present invention, or that any reference forms a part of the common general knowledge in the art.

SUMMARY

The present invention is directed to a storage device having a preferable structural strength.

The storage device of the present invention includes a bearing member, a storage unit, and a casing. The casing has a bottom plate, a top plate and a main assembling structure. The bearing member has an interfering portion and a sub-assembling structure. The storage unit has a body, a limiting portion and a terminal set. The body has a first surface and a second surface opposite to each other. Parts of the terminal set and the limiting portion are located at the first surface. The storage unit and the interfering portion are accommodated in the casing. The interfering portion is located between the top plate and the limiting portion. The interfering portion provides an interfering force to the limiting portion, and the bottom plate provides a supporting force to the second surface, so that the storage unit is positioned in the casing. The main assembling structure and the sub-assembling are assembled detachably to each other to configure or detach the bearing member and the casing.

According to an exemplary embodiment of the present invention, the interfering portion has a third surface and a fourth surface opposite to each other. The top plate faces the third surface, and the limiting portion protrudes from the first surface and faces the fourth surface.

According to an exemplary embodiment of the present invention, the sub-assembling structure includes a first assembling portion or a pair of fourth assembling portions, or the first assembling portion and the pair of fourth assembling portions. The first assembling portion is located at the third surface. The fourth assembling portions are located at two opposite sides of the interfering portion. The main assembling structure includes a second assembling portion or a pair of third assembling portions, or the second assembling portion and the pair of third assembling portions. The second assembling portion is located at the top plate. The third assembling portions are located at a pair of side plates of the casing. Each of the side plates is connected between the top plate and the bottom plate. The first assembling portion is configured to be assembled to the second assembling portion, and the pair of fourth assembling portions is configured to be assembled to the pair of third assembling portions.

According to an exemplary embodiment of the present invention, the first assembling portion is one of an engaging member and an engaging slot, and the first assembling portion is another one of the engaging member and the engaging slot.

According to an exemplary embodiment of the present invention, the interfering portion further includes at least one first protruding portion located on the fourth surface. The limiting portion has a plurality of distance blocks. The first protruding portion is correspondingly propped between two adjacent distance blocks.

According to an exemplary embodiment of the present invention, the interfering portion further includes at least one second protruding portion located on the fourth surface. The second protruding portion is propped against a side surface of the body.

According to an exemplary embodiment of the present invention, the bearing member includes a plate body having a bearing surface. The interfering portion is extended from the plate body. The body is divided into a first portion and a second portion sharing the first surface. The terminal set and the limiting portion are located at the first portion and in the casing together with first portion. The second portion is extended from the first portion outside of the casing and propped against the bearing surface.

According to an exemplary embodiment of the present invention, a gap is provided between the interfering portion and the plate body.

According to an exemplary embodiment of the present invention, the interfering portion and the fourth assembling portions are respectively extended from the plate body, and the interfering portion is located between the fourth assembling portions. When the interfering portion is accommodated in the casing, an external distance of the fourth assembling portions is greater than an external distance of the side plates.

According to an exemplary embodiment of the present invention, the third assembling portions are a pair of slots, and parts of the fourth assembling portions are embedded in the slots.

According to an exemplary embodiment of the present invention, the third assembling portions are a pair of engaging members or a pair of engaging slots, and the fourth assembling portions are a pair of engaging slots or a pair of engaging members.

According to an exemplary embodiment of the present invention, the terminal set is a transmitting interface with four-wire differential transmission.

According to an exemplary embodiment of the present invention, the terminal set is a transmitting interface with two-wire differential transmission.

According to an exemplary embodiment of the present invention, the terminal set is a Universal Serial Bus (USB3.0) terminal set.

According to an exemplary embodiment of the present invention, the storage unit is of a system in package (SIP) structure.

Based on above, when the interfering portion and the storage unit are accommodated in the casing, the interfering portion may provide the interfering force to the limiting portion of the storage unit, and the bottom plate of the casing may provide the supporting force to the storage unit, such that the storage unit may be positioned in the casing. The interfering portion is located between the limiting portion and the top plate of the casing, so as to assemble the casing, the bearing member and the storage unit as a stacking structure thereby enhancing the structural strength of the storage device. Meanwhile, parts of the bearing member located outside of the casing may be assembled to various outer shells, so as to provide a holding effect for the user.

It should be understood, however, that this Summary may not contain all of the aspects and embodiments of the present invention, is not meant to be limiting or restrictive in any manner, and that the invention as disclosed herein is and will be understood by those of ordinary skill in the art to encompass obvious improvements and modifications thereto.

To make the above features and advantages of the invention more comprehensible, several embodiments accompanied with drawings are described in detail as follows.

DESCRIPTION OF THE EMBODIMENTS

Figure 1:
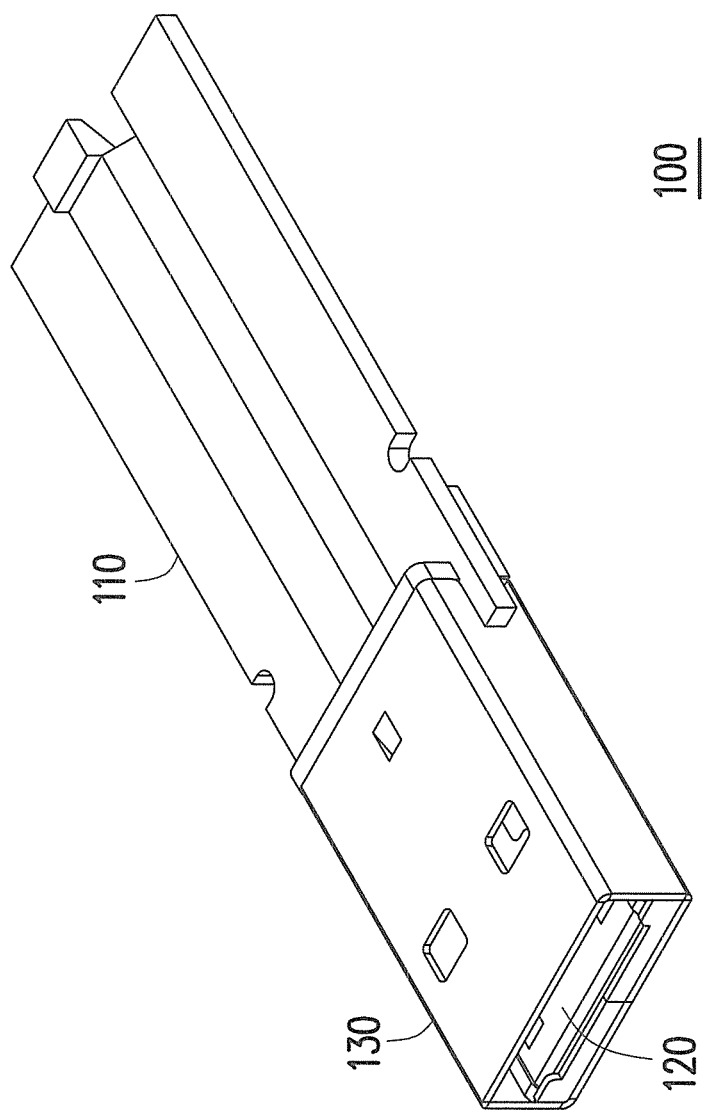
FIG. 1 is a schematic view of a storage device according to an embodiment of the present invention.

Reference will now be made in detail to the present preferred embodiments of the invention, examples of which are illustrated in the accompanying drawings. Wherever possible, the same reference numbers are used in the drawings and the description to refer to the same or like parts.

Embodiments of the present invention may comprise any one or more of the novel features described herein, including in the Detailed Description, and/or shown in the drawings. As used herein, "at least one", "one or more", and "and/or" are open-ended expressions that are both conjunctive and disjunctive in operation. For example, each of the expressions "at least one of A, B and C", "at least one of A, B, or C", "one or more of A, B, and C", "one or more of A, B, or C" and "A, B, and/or C" means A alone, B alone, C alone, A and B together, A and C together, B and C together, or A, B and C together.

It is to be noted that the term "a" or "an" entity refers to one or more of that entity. As such, the terms "a" (or "an"), "one or more" and "at least one" can be used interchangeably herein.

Figure 2:
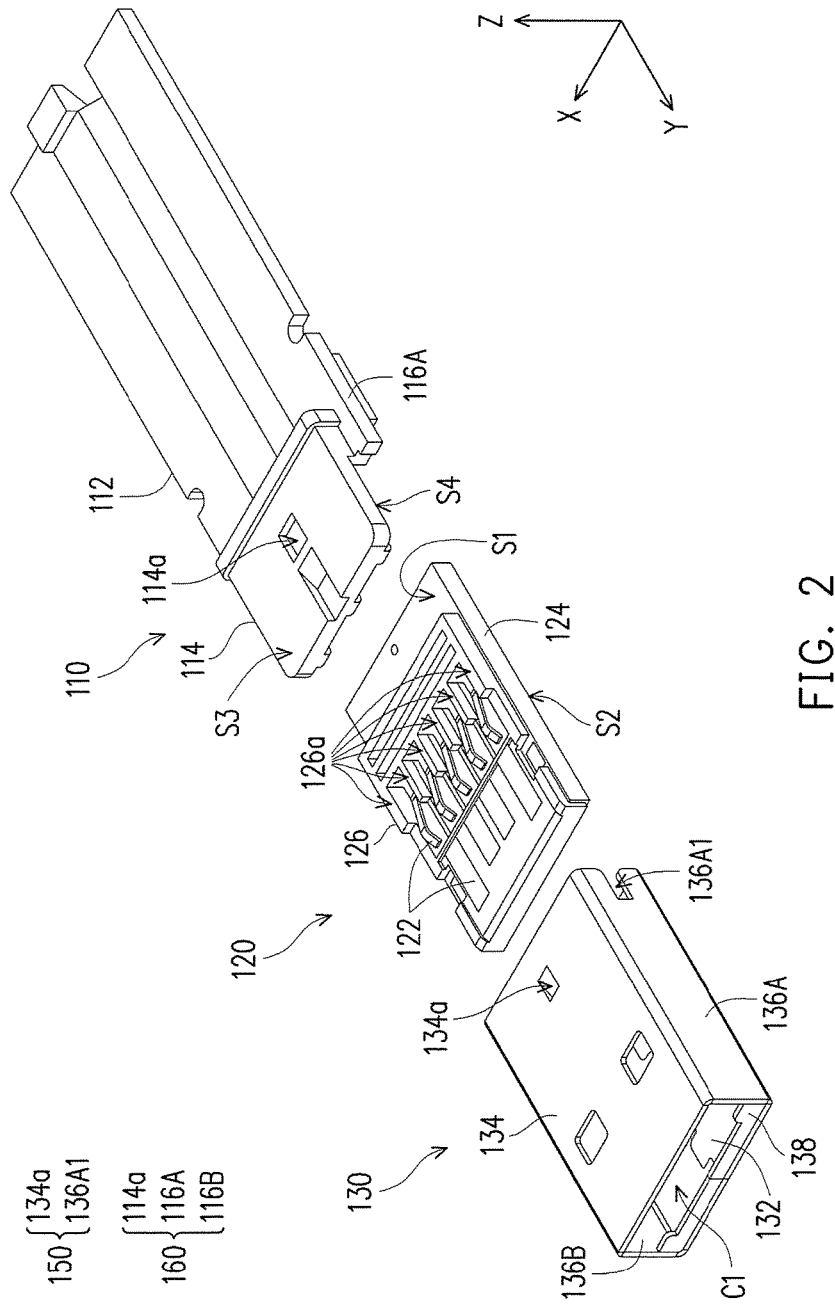
FIGS. 2 and 3 are explosion diagrams of the storage device depicted in FIG. 1 respectively from different viewing angles.
Figure 3:
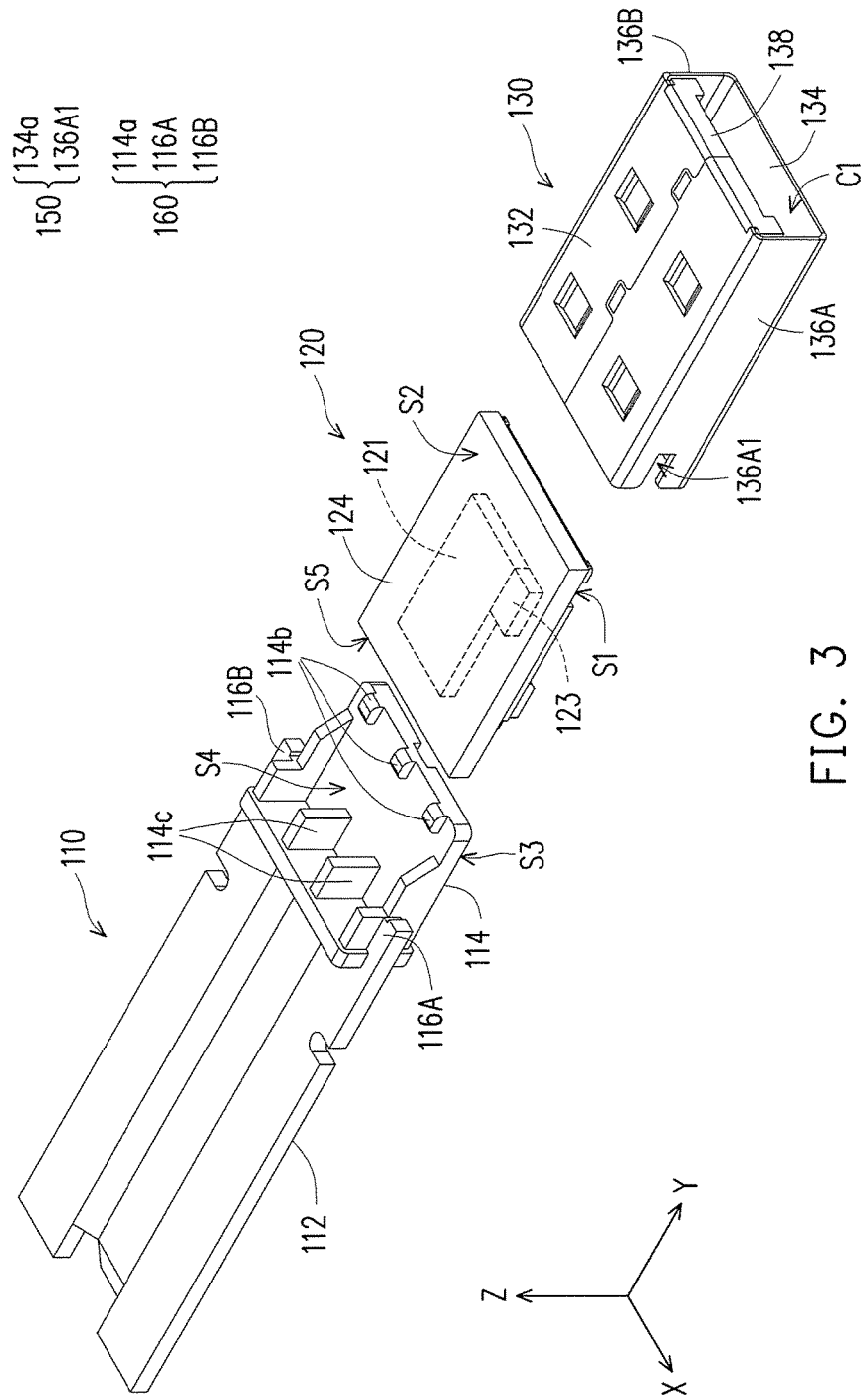
Figure 4:
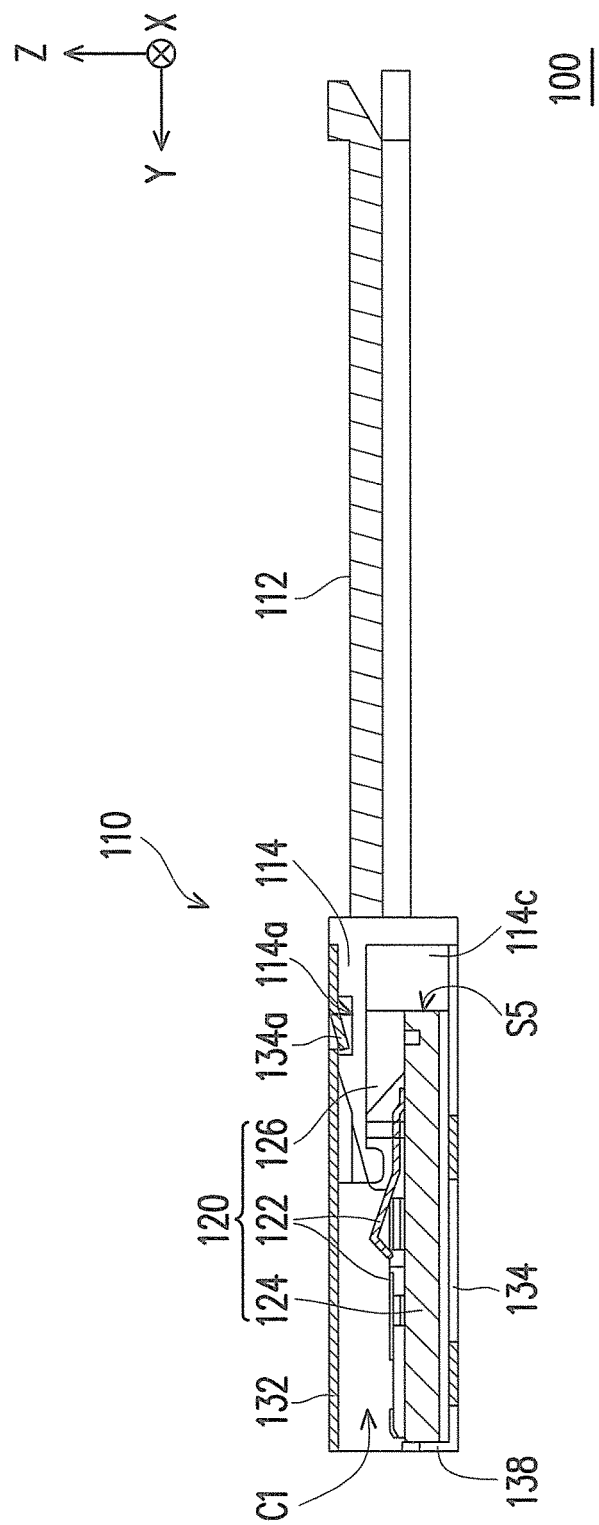
FIG. 4 is a cross-sectional view of the storage device depicted in FIG. 1.

FIG. 1 is a schematic view of a storage device according to an embodiment of the present invention. FIGS. 2 and 3 are explosion diagrams of the storage device depicted in FIG. 1 respectively from different viewing angles. FIG. 4 is a cross-sectional view of the storage device depicted in FIG. 1. Referring to FIG. 1 to FIG. 4 together, in the present exemplary embodiment, a storage device 100 is, for example, a flash drive structure compatible with Universal Serial Bus (USB3.0) specification, which includes a bearing member 110, a storage unit 120 and a casing 130. In which the storage unit 120 is manufactured by system in package (SIP) technology, which is a package with one or more chips 121 as a chip package being added with more than one device 123 selected from a group consisting of a passive device, a capacitor, a resistor, a connector, an antenna and so on. The storage unit 120 has a transmitting interface with four-wire differential transmission, such as a terminal set 122 in compliance with USB3.0 specification (as shown in FIG. 2, it is illustrated herein using only one terminal as an example). Said transmission interface may include five USB3.0 transmission terminals and a transmission terminal configured to electrically connect to the casing 130. In another exemplary embodiment, a transmitting interface with backward compatibility to two-wire differential transmission (e.g., a USB2.0 transmission terminal) may also be included.

More specifically, USB2.0 (or USB2.0 compatible) transmits data by using a twisted wire respectively marked as D+ and D−, so as to compensate electromagnetic interference by long wire. In which a half-duplex differential signal is utilized for collaborative work, namely, a two-wire differential transmission. However, since "transmitting" and "receiving" are sharing the same bandwidth, an overall performance is restricted because only signals with same direction may flow (transmit or receive) at the same time. Therefore, besides D+ and D− terminals of USB 2.0 as described above, the terminal set 122 compatible with USB 3.0 specification may also include four data transmitting wires TX+, TX−, RX+ and RX−, in which TX+ and TX− are a differential pair for transmitting signal independently, whereas RX+ and RX− are a differential pair for receiving signal independently. Accordingly, when an electronic device is connected to the storage device with above configuration, TX+ and TX− are used for transmitting signals and RX+ and RX+ are used for receiving signals, so as form a four wire transmission while realizing a bidirectional signal transmission, namely, a full-duplex mode.

In addition, in the present exemplary embodiment, the bearing member 110 may include a plate body 112 and an interfering portion 114 extended from the plate body 112. The casing 130 is, for example, a metal casing formed by a bended plate member or assembled by a plurality of devices, which is configured as a docking structure of the storage device 100 to other electronic devices (not illustrated). According to the present exemplary embodiment, the interfering portion 114 and the storage unit 120 may be partially or entirely placed or embedded in the casing 130, and the interfering portion 140 is disposed or propped between storage unit 120 and the casing 130.

More specifically, according to an exemplary embodiment of the present invention, the casing 130 has a bottom plate 132, a top plate 134 and a pair of side plates 136A and 136B. Each of the side plates 136A and 136B is connected between the bottom plate 132 and the top plate 134 so as to surround and define a hollow portion C1 to accommodate the storage unit 120 and the interfering portion 140 therein. Moreover, the storage unit 120 further includes a body 124 and a limiting portion 126, in which the body 124 has a first surface S1 and a second surface S2 opposite to each other. The limiting portion 126 is configured to cooperate with the interfering portion 114, so as to limit the body 124 at a fixed position, and the limiting portion 126 may protrude from the first surface. Parts of the terminal set 122 may be exposed to the first surface S1 of the body 124. The second surface S2 is propped against the bottom plate 132 of the casing 130, and the interfering portion 114 may be propped or inserted between the limiting portion 126 and the top plate 134.

In light of above, the parts of the terminal set 122 and the limiting portion 126 are located at the first surface, the storage unit 120 and the interfering portion 114 are accommodated in the casing 130, and the interfering portion 114 is located between the top plate 134 and the limiting portion 126, in which the interfering portion 114 may provide an interfering force directly or indirectly to the limiting portion 126 and the bottom plate 132 may provide a supporting force directly or indirectly to the second surface S2, such that the storage unit 120 may be positioned in the casing 130. In the present exemplary embodiment, the interfering portion 114 is directly prop against the limiting portion 126, whereas in another exemplary embodiment not shown, a user may add a pad to this stacking structure, so as to allow the interfering portion to provide the interfering force indirectly.

It should be noted that, the casing 130 has a main assembling structure 150 and the bearing portion 110 has a sub-assembling structure 160 corresponding to the main assembling structure 150, and the main assembling structure 150 and the sub-assembling structure 160 are assembled detachably to each other to configure or detach the bearing member 110 and the casing 130. More specifically, the interfering portion 114 has a first assembling portion 114a as well as a third surface S3 and a fourth surface S4 facing each other. The top plate 134 of the casing 130 has a second assembling portion 134a, in which the fourth surface S4 faces and props against the limiting portion 126 of the storage unit 120. According to the present exemplary embodiment, the first assembling portion 114a is an engaging slot located at the third surface S3, and the second assembling portion 134a is an engaging member such as a pressed tongue piece formed by the top plate 134 being pressed to extend towards the hollow portion C1. Accordingly, after the bearing member 110 is assembled to the casing 130 along a positive direction of Y-axis, the engaging member is propped against the engaging slot accordingly, so as to provide a fixing effect towards Y-axis for the bearing member 110 and the casing 130, that is, the interfering portion 114 of the bearing portion 110 may not be easily detached from the casing 130 along a negative direction of Y-axis owing to the structural features of the first assembling portion 114a and the assembling portion 134a. It should be noted that, a method for assembling the first assembling portion 114a and the second assembling portion 134a is not particularly limited herein. That is, according to another embodiment not shown, the first assembling portion may also be an engaging member and the second assembling portion may also be an engaging slot. Similarly, any assembling means (such as snapping, clicking and so on) which may be sued to achieve the same effect of assembling the said components may be applied for the present invention.

Based on above, the bearing portion 110 may be propped between the top plate 134 and the limiting portion 126 of the storage 120 by the interfering portion 114, so that the casing 130, the storage unit 120 and the bearing member 110 may be partially stacked and clamped to each other thereby fixing each other along Z-axis. Meanwhile, such stacking structure may also enhance the structural strength of the storage device 100. Further, under the premise of its shape being compliance with the relevant specification, the bearing member 110 located outside of the casing 130 may be assembled to various outer shells, so as to provide a holding effect for the user.

Figure 5:
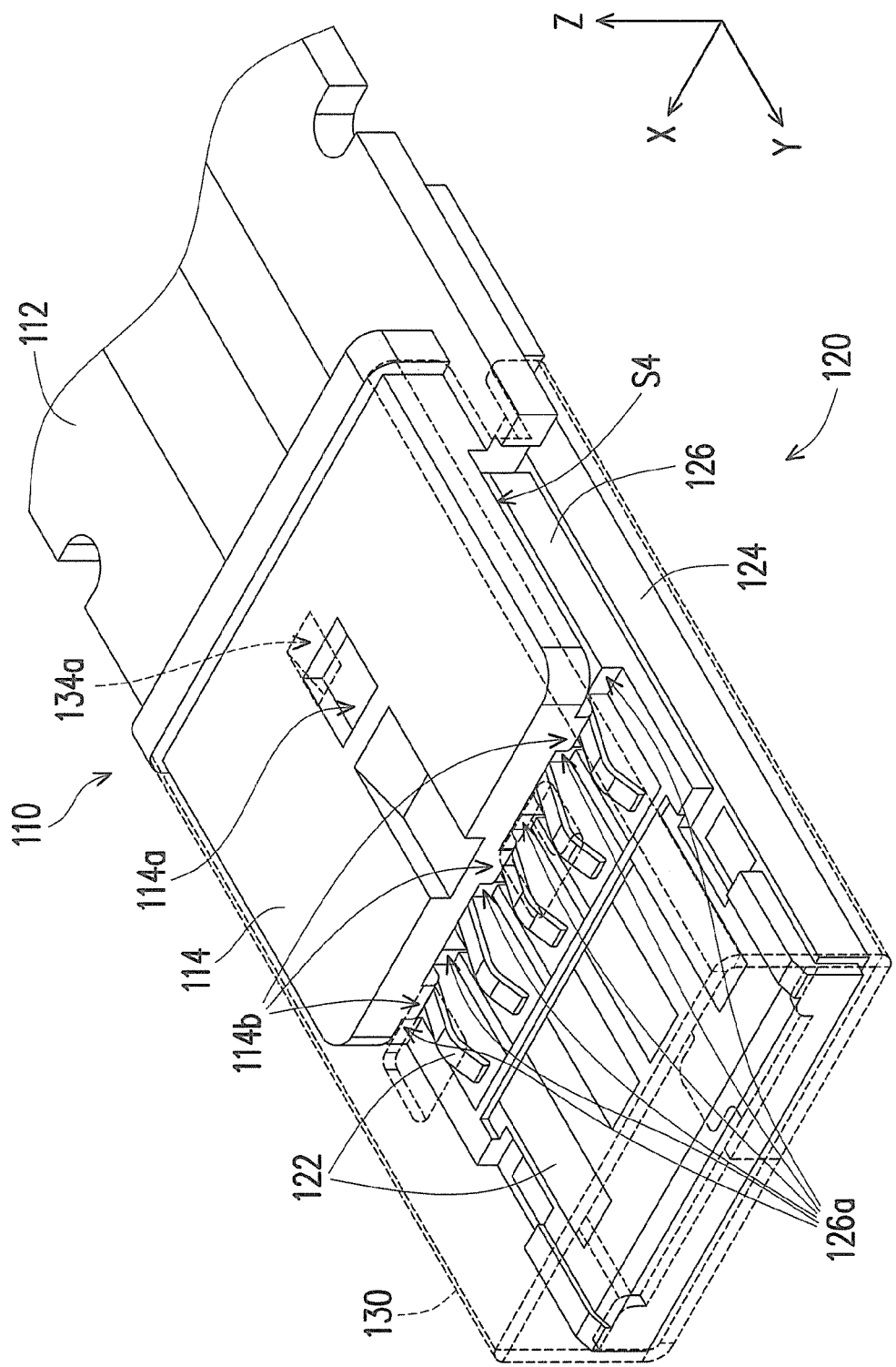
FIG. 5 is an enlarged partial view of the storage device depicted in FIG. 1.

FIG. 5 is an enlarged partial view of the storage device depicted in FIG. 1. Here, the casing 130 is illustrated as being transparent (with dotted line) to clearly illustrate an assembling relation between the storage unit 120 and the interfering portion 114. Referring to FIG. 2, FIG. 3 and FIG. 5 together, in the bearing member 110 of the present invention, the interfering portion 114 further includes at least one first protruding portion 114b (three of which are illustrated in the present exemplary embodiment, but the invention is not limited thereto) located at the fourth surface S4 and arranged along X-axis. The limiting portion 126 of the storage unit 120 has a plurality of distance blocks 126a, which are also arranged along X-axis and located between two adjacent terminals of the terminal set 122 as shown in FIG. 2. The distance blocks 126a are substantially located between said USB3.0 terminals. When the bearing member 110 and the storage unit 120 are embedded in the casing 130 at the same time, the first protruding portion 114b is propped between two adjacent distance blocks 126a correspondingly, thereby positioning the bearing member 110 and the storage unit 120 to each other.

In addition, referring back to FIG. 3 and FIG. 4 together, the interfering portion 114 of the bearing member 110 further includes at least one second protruding portion 114c (two of which are illustrated in the present exemplary embodiment, but the invention is not limited thereto) such as protruding ribs located on the fourth surface S4. When the bearing member 110 and the storage unit 120 are embedded in the casing 130 at the same time, the second protruding portion 114c is propped against a side surface S5 of the body 124 thereby clamping the storage unit 120 along Y-axis between the second protruding portion 114c and a stopper 138 of the casing 130.

Figure 6:
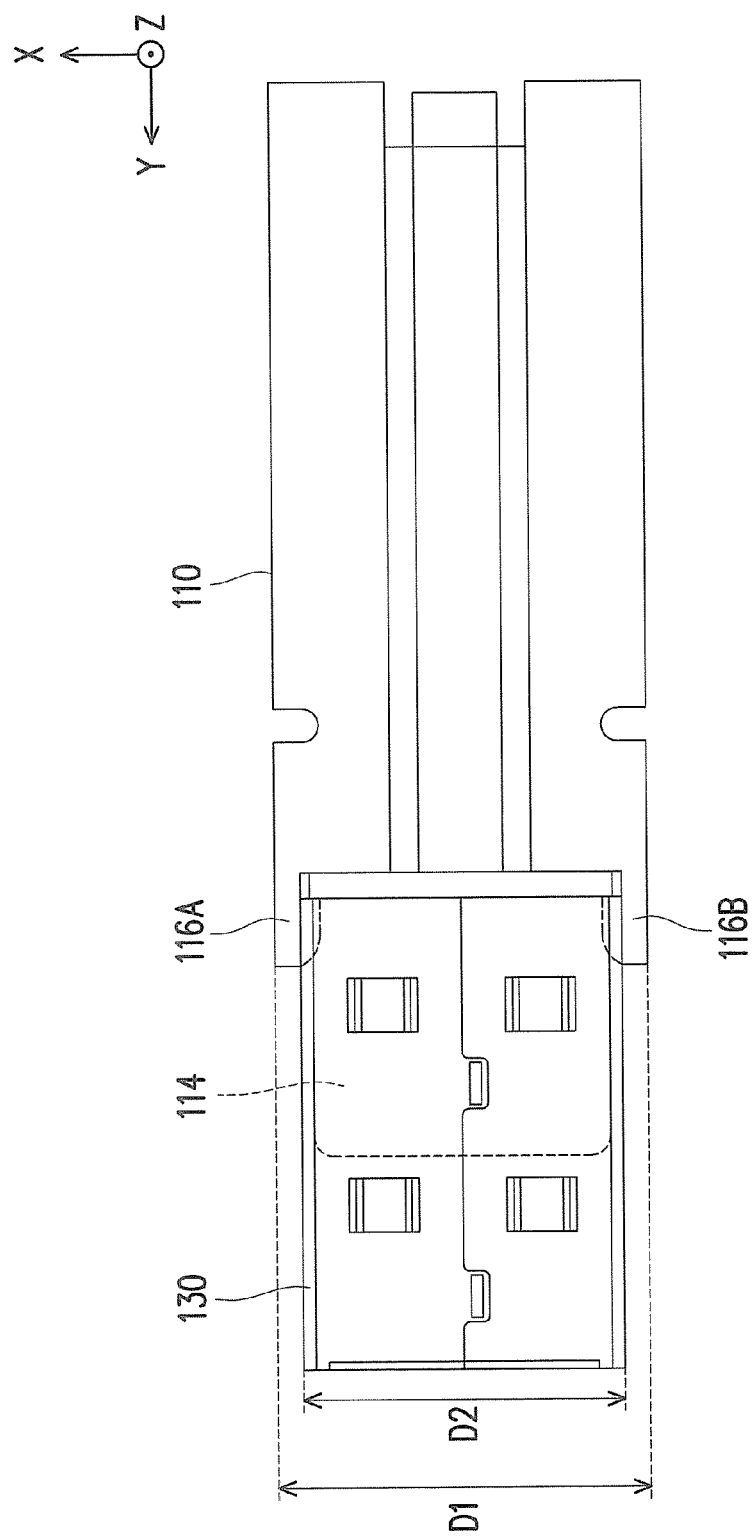
FIG. 6 is a bottom view of the storage device depicted in FIG. 1.

On the other hand, FIG. 6 is a bottom view of the storage device depicted in FIG. 1. Referring to FIG. 3 and FIG. 6 together, according to the present exemplary embodiment, the main assembling structure 150 of the casing 130 further includes a third assembling portion 136A1 being a slot located on the side plate 136A (FIG. 3 is illustrated with only one of the two sides, the side plate 136B on the other side may also have the same structure). The sub-assembling structure 160 of the bearing member 110 further includes a pair of fourth assembling portions 116A and 116B being, for example, a pair of pressing strips extended from the pate body 112 and located at two opposite sides of the interfering portion 114 along X-axis. That is, an orthogonal projection of the interfering portion 114 on a X-Y plane is located between orthogonal projections of the pair of fourth assembling portions 116A and 116B on the X-Y plane. Further, when the bearing member 110 is embedded in the casing 130, parts of the pair of fourth assembling portions 116A and 116B are embedded in the third assembling portion 136A1 as an auxiliary connecting structure between the bearing member 110 and the casing 130. After above assembly is completed, an external distance D1 between the pair of fourth assembling portions 116A and 116B is greater than an external distance D2 between the side plates 136A and 136B, so as to allow the storage device 100 to be compliance with the relevant specification in dimensions. Types and amount of the main assembling structure 150 and sub-assembling structure 160 in the present embodiment are not particularly limited. In another embodiment not shown, the main assembling structure 150 may only include the second assembling portion or a pair of the third assembling portions, and the sub-assembling structure 160 may only include the first assembling portion or a pair of the fourth assembling portions. In other words, the first assembling portion and the second assembling portion corresponding to each other, or the third assembling portion and the fourth assembling portion corresponding to each other, all of which may independently provide an effect of assembling the bearing member 110 and the casing 130.

Figure 7:
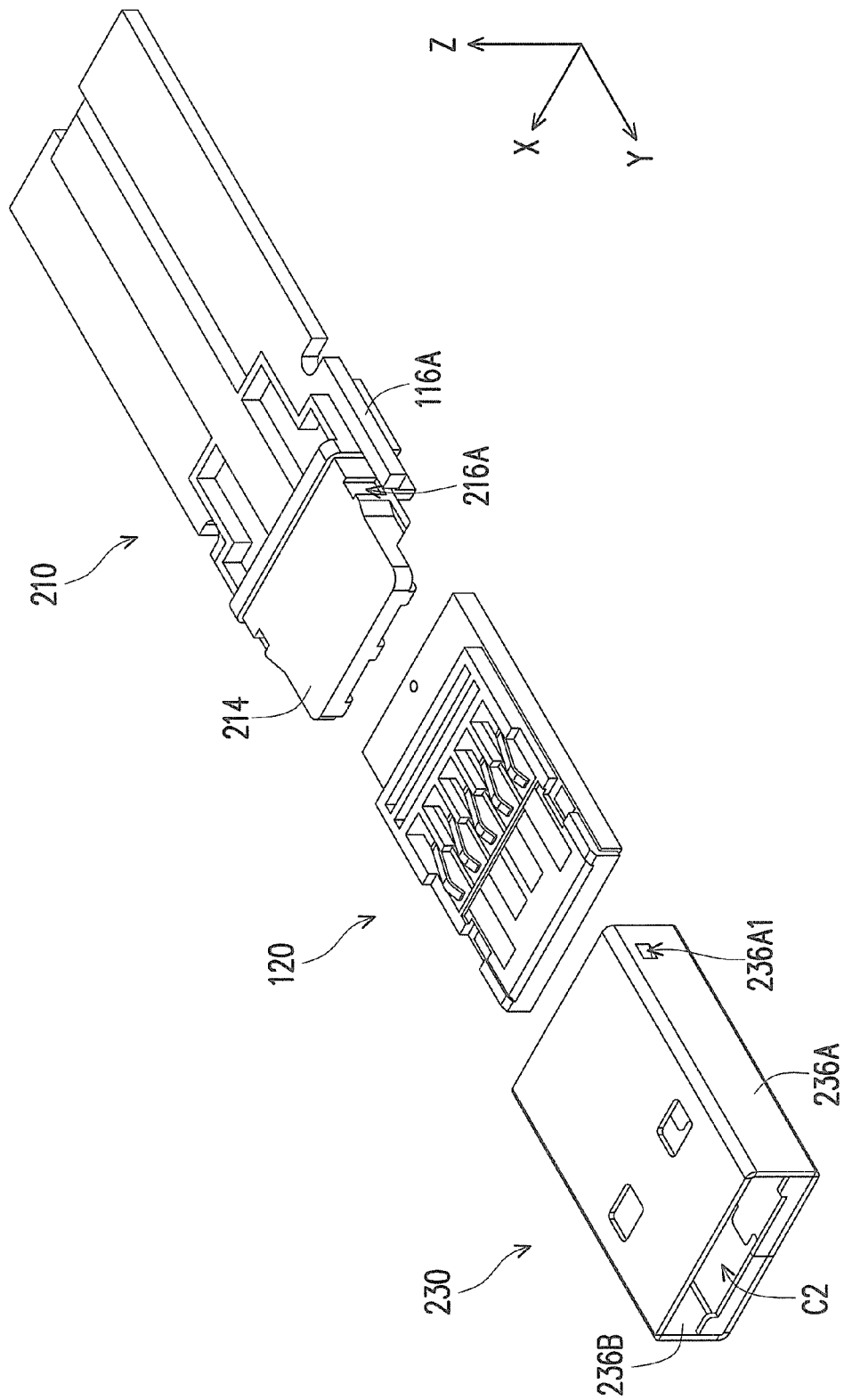
FIG. 7 is an explosion diagram of a storage device according to another embodiment of the present invention.

FIG. 7 is an explosion diagram of a storage device according to another embodiment of the invention. Referring to FIG. 7, differences thereof in comparing to above embodiments are: a side plate 236A of a casing 230 has a third assembling portion 236A1 (which is the same for the other side not shown) being an engaging member such as a pressed tongue piece formed by the side plate 236A being pressed to extended towards a hollow portion C2. Correspondingly, a bearing member 210 has a pair of fourth assembling portions 216A (it is only illustrated with the one corresponding to the side plate 236A herein) being engaging slots formed at two opposite side of an interfering portion 214. Accordingly, when the bearing member 210 and the casing 230 are assembled, the third assembling portion 236A1 is snapped and propped correspondingly in the fourth assembling portion 216A thereby positioning the bearing member 210 and the casing 230 along Y-axis.

On the other hand, in the present embodiment, a gap is provided between the fourth assembling portions (116A and 116B, referring to FIG. 3) and the interfering portion 214. After the bearing member 210 and the casing 230 are assembled, the side plates 236A and 236B of the casing 230 may respectively embedded in the gap between the fourth assembling portions (116A and 116B) and the interfering portion 214, so as to provide the same effect of assembling the bearing member 210 and the casing 230 to each other. Similarly, the third assembling portion and the fourth assembling portion of the present embodiment may also independently provide the effect of assembling the bearing member 210 and the casing 230, so as to be used together with the assembling portions as described in the above embodiment.

Figure 8:
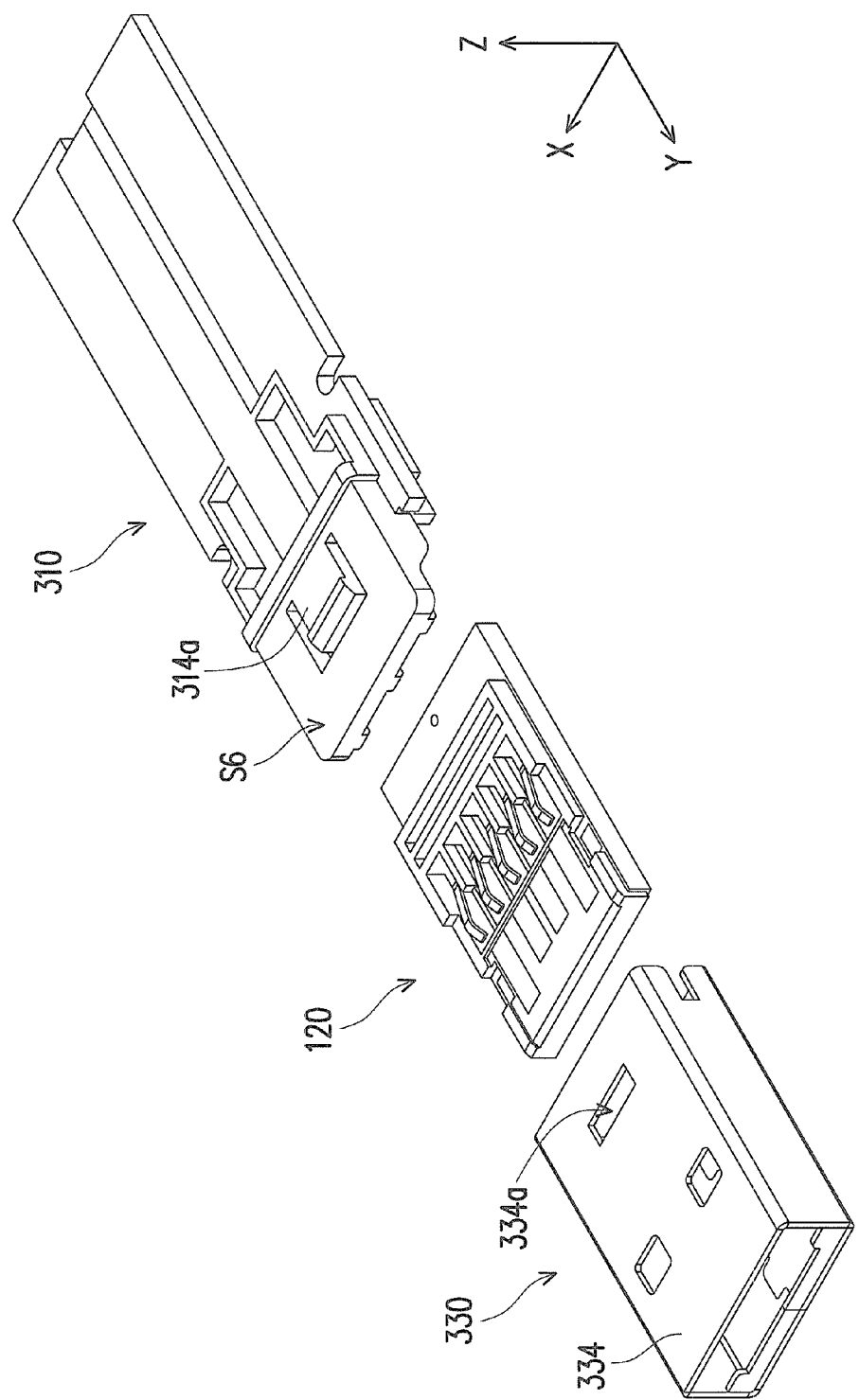
FIG. 8 is an explosion diagram of a storage device according to yet another embodiment of the present invention.

FIG. 8 is an explosion diagram of a storage device according to yet another embodiment of the present invention. Differences thereof in comparing to the above embodiment are: a first assembling portion 314a is an engaging member located on a third surface S6, and a second assembling portion 334a is an engaging slot located on a top plate 334a of a casing 330, which is similar to the exemplary embodiment as illustrated in FIG. 2. The first assembling portion 314a and the assembling portion 334a may also avoid the bearing member 310 to be easily detached from the casing 330 along a negative direction of Y-axis.

Figure 9:
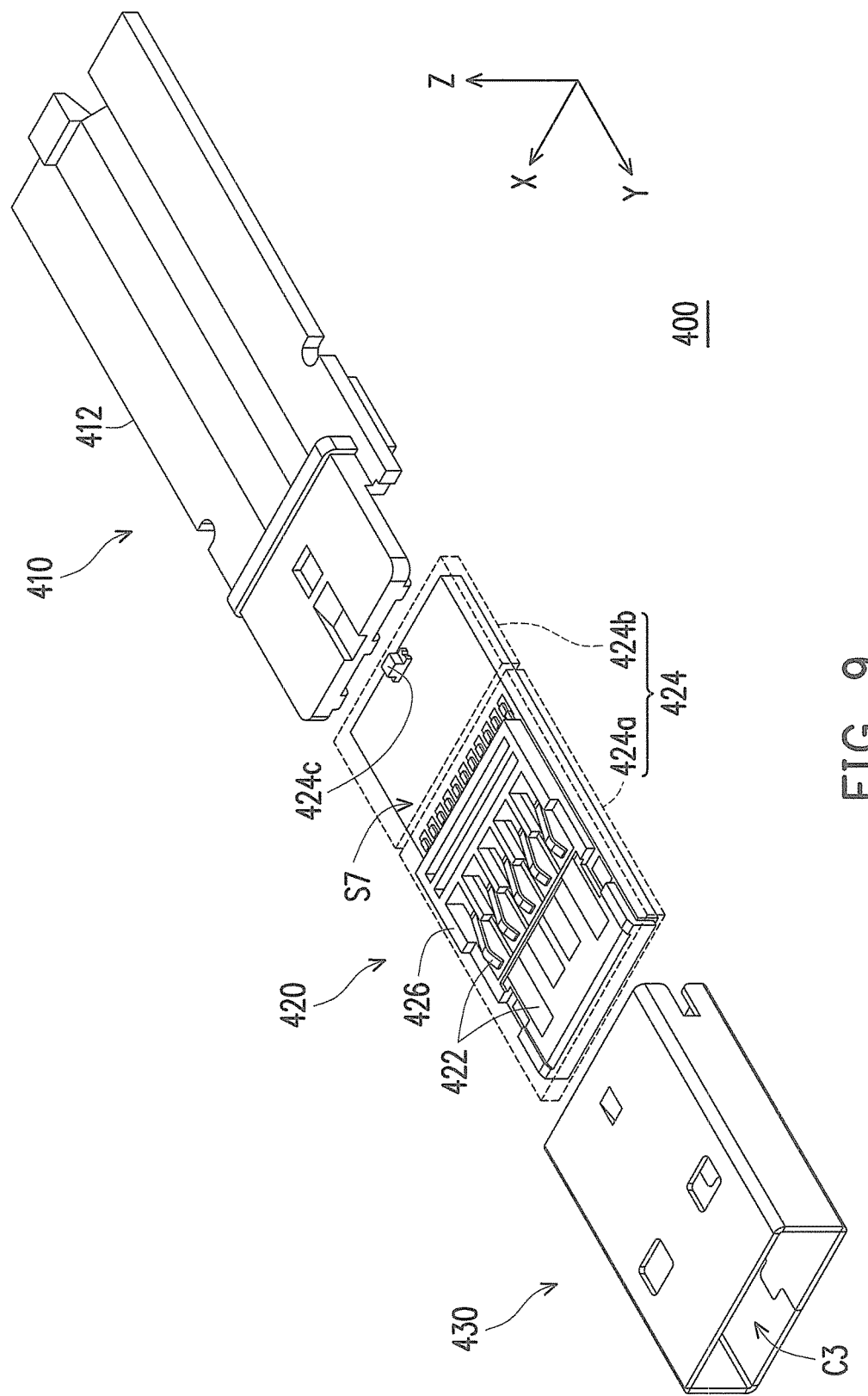
FIG. 9 and FIG. 10 are explosion diagrams of a storage device according to again another embodiment of the invention respectively from different angles.
Figure 10:
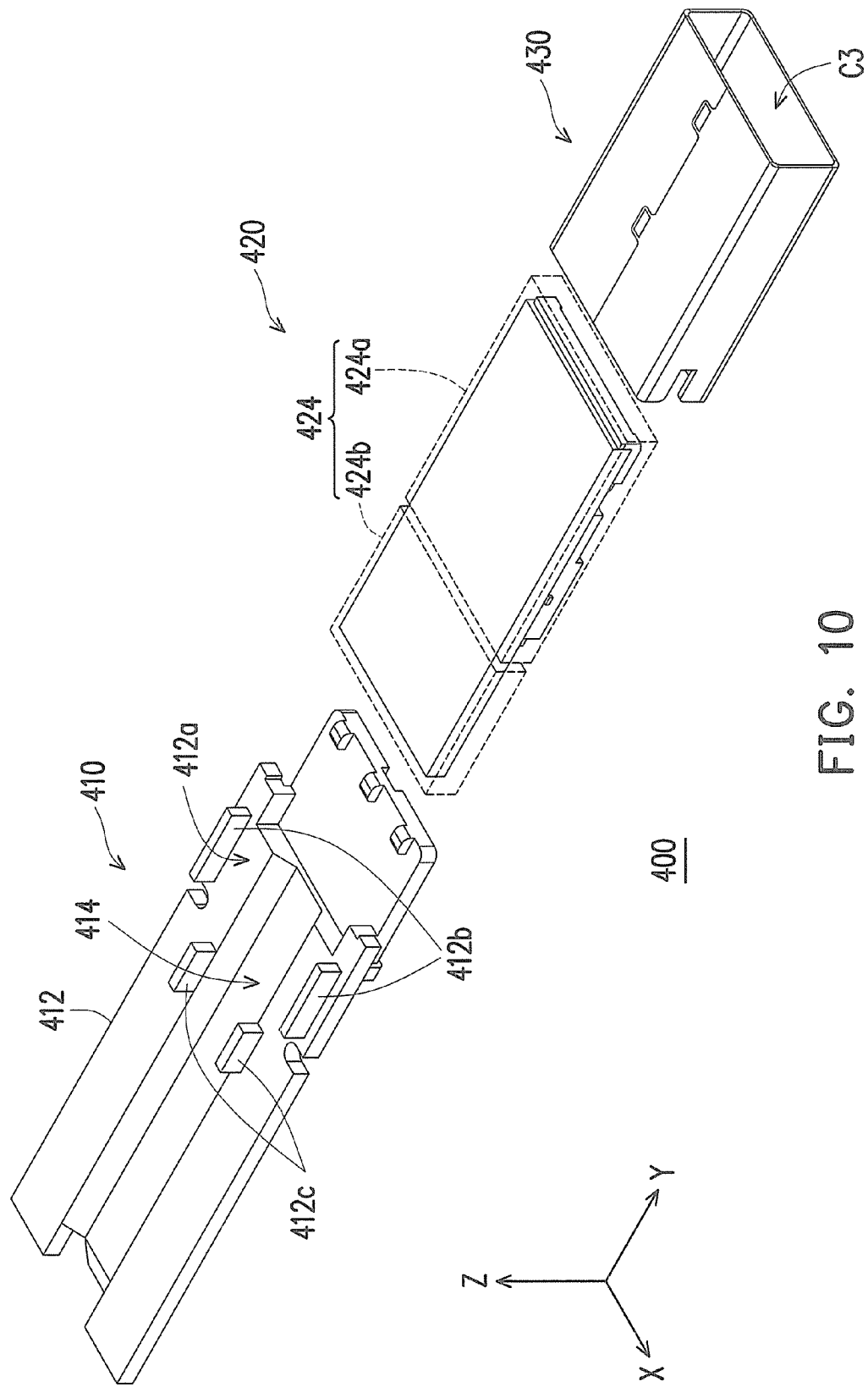
Figure 11:
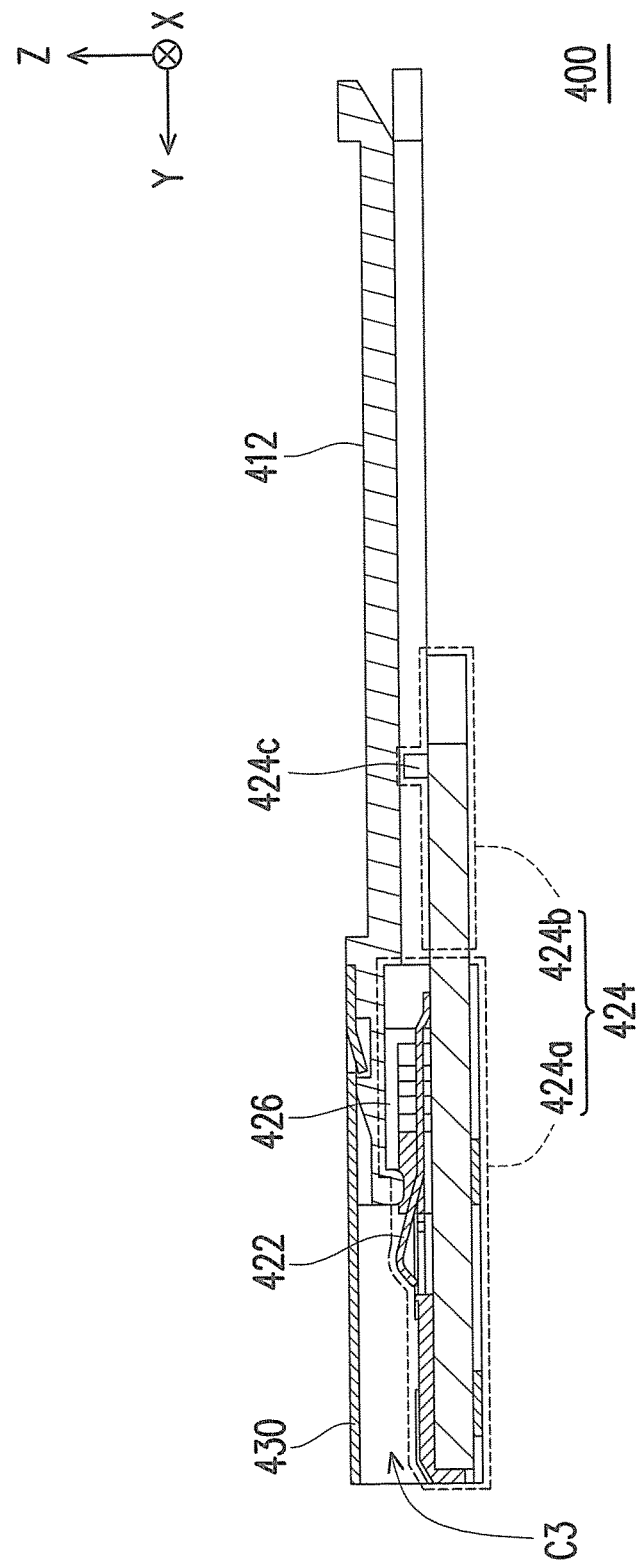
FIG. 11 is a cross-sectional view of the storage device depicted in FIG. 9 after being assembled.

FIG. 9 and FIG. 10 are explosion diagrams of a storage device according to again another embodiment of the present invention respectively from different angles. FIG. 11 is a cross-sectional view of the storage device depicted in FIG. 9 after being assembled. Referring to FIG. 9 to FIG. 11 together, differences thereof in comparing to above exemplary embodiments are: a plate body 412 of a bearing member 410 has a bearing surface 412a and a guiding portion 412b and a stopper portion 412c located next to the bearing surface 412a, and a body 424 of a storage unit 420 is divided into a first portion 424a and a second portion 424b sharing a first surface S7, in which a terminal set 422 and a limiting portion 426 are located at the first portion 424a and in a hollow portion C3 of a casing 430 where the first portion 424a is located. It should be noted that, the second portion 424b of the body 424 is extended from the first portion 424a to the outside of the casing 430, and propped against the bearing surface 412a of the plate body 412 owing to a guiding effect of the guiding portion 412b and a limiting effect of the stopper 412c.

More specifically, the storage unit 420 of the present embodiment has the second portion 424b located outside of the casing 430 and configured as the stacking structure for the plate body 412 of the bearing member 410, so as to increase an overlapping area of the bearing member 410 and the storage unit 420 thereby enhancing the structural strength of a storage device 400. Moreover, the body 424 of the storage unit 420 further includes a third protruding portion 424c located at the second portion 424b and propped against a recess 414 of the bearing member 410 located on the plate body 412, such that the bearing member 410 and the storage unit 420 may be propped against and fixed to each other.

In view of above, in the exemplary embodiments of the present invention, the interfering portion of the bearing member is placed between the storage unit and the casing, so the interfering portion may provide an interfering force directly or indirectly to the limiting portion of the storage unit, and the bottom plate of the casing may provide a supporting force directly or indirectly to the storage unit, such that the storage unit may be positioned in the casing. The interfering portion is located between the limiting portion and the top plate of the casing to enhance the structural strength of the storage device, so as to further improve reliability and durability of the storage device. Meanwhile, parts of the bearing member located outside of the casing may be assembled to various outer shells, so as to provide a holding effect for the user.

In addition, the main assembling structure of the casing and the sub-assembling structure of the bearing member may be correspondingly assembled, so that the bearing member and the casing may be easily configured and detached, so as to facilitate in assembling and maintaining the storage device. The previously described exemplary embodiments of the present invention have the advantages aforementioned, wherein the advantages aforementioned not required in all versions of the invention.

Although the present invention has been described with reference to the above embodiments, it will be apparent to one of ordinary skill in the art that modifications to the described embodiments may be made without departing from the spirit of the invention. Accordingly, the scope of the invention will be defined by the attached claims and not by the above detailed descriptions.

What is claimed is:

1. A storage device, comprising:
a casing having a bottom plate, a top plate, and a main assembling structure;
a bearing member having an interfering portion and a sub-assembling structure; and
a storage unit having a body, a limiting portion and a terminal set, wherein the body has a first surface and a second surface opposite to each other, parts of the terminal set and the limiting portion are located at the first surface, the storage unit and the interfering portion are accommodated in the casing, and the interfering portion is located between the top plate and the limiting portion, wherein the interfering portion provides an interfering force to the limiting portion and the bottom plate provides a supporting force to the second surface so that the storage unit is positioned in the casing, and the main assembling structure and the sub-assembling structure are assembled detachably to each other to configure or detach the bearing member and the casing, wherein the body has at least one memory chip and elements belonging to the body are entirely enclosed in a single package, and
wherein a length of the bearing member along a first axis is greater than a length of the storage unit along the first axis, and the first axis is parallel to the first surface.

2. The storage device of claim 1, wherein the interfering portion comprises a third surface and a fourth surface opposite to each other, the top plate faces the third surface and the limiting portion protrudes from the first surface and faces the fourth surface.

3. The storage device of claim 2, wherein the sub-assembling structure comprises a first assembling portion located at the third surface,
wherein the main assembling structure comprises a second assembling portion located at the top plate,
wherein the first assembling portion is configured to be assembled to the second assembling portion.

4. The storage device of claim 3, wherein the first assembling portion is one of an engaging member and an engaging slot, and the second assembling portion is another one of the engaging member and the engaging slot.

5. The storage device of claim 1, wherein the sub-assembling structure comprises a pair of fourth assembling portions, and each of the fourth assembling portions are respectively located at two opposite sides of the interfering portion,
wherein the main assembling structure comprises a pair of third assembling portions located at a pair of side plates of the casing, and each of the side plates is connected between the top plate and the bottom plate,
wherein the pair of fourth assembling portions are configured to be assembled to the pair of third assembling portions.

6. The storage device of claim 5, wherein the pair of third assembling portions is a pair of slots, and parts of the pair of fourth assembling portions are embedded in the pair of slots.

7. The storage device of claim 5, wherein the pair of third assembling portions is a pair of engaging members or a pair of engaging slots, and the pair of fourth assembling portions is a pair of engaging slots or a pair of engaging members.

8. The storage device of claim 2, wherein the sub-assembling structure comprises a first assembling portion and a pair of fourth assembling portions, the first assembling portion being located at the third surface, the pair of fourth assembling portions being located at two opposite sides of the interfering portion,
wherein the main assembling structure comprises a second assembling portion and a pair of third assembling portions, the second assembling portion being located at the top plate, the pair of third assembling portions being located at a pair of side plates of the casing, and each of the side plates is connected between the top plate and the bottom plate,
wherein the first assembling portion is configured to be assembled to the second assembling portion, and the pair of fourth assembling portions are configured to be assembled to the pair of third assembling portions.

9. The storage device of claim 8, wherein the first assembling portion is one of an engaging member and an engaging slot, and the second assembling portion is another one of the engaging member and the engaging slot,
wherein the pair of third assembling portions is a pair of slots, and parts of the pair of fourth assembling portions are embedded in the pair of slots.

10. The storage device of claim 8, wherein the first assembling portion is one of an engaging member and an engaging slot, and the second assembling portion is another one of the engaging member and the engaging slot,
wherein the pair of third assembling portions is a pair of engaging members or a pair of engaging slots, and the pair of fourth assembling portions is a pair of engaging slots or a pair of engaging members.

11. The storage device of claim 8, wherein the bearing member comprises a plate body that the interfering portion and the pair of fourth assembling portions are respectively extended from the plate body, and the interfering portion is located between the pair of fourth assembling portions,
wherein an external distance between the pair of fourth assembling portions is greater than an external distance between the pair of side plates when the interfering portion is accommodated in the casing.

12. The storage device of claim 2, wherein the interfering portion further comprises at least one first protruding portion located on the fourth surface, and the limiting portion comprises a plurality of distance blocks, the first protruding portion being propped against correspondingly in between two adjacent distance blocks.

13. The storage device of claim 2, wherein the interfering portion further comprises at least one second protruding portion located on the fourth surface, the second protruding portion being propped against a side surface of the body.

14. The storage device of claim 2, wherein the bearing member comprises a plate body having a bearing surface, and the interfering portion is extended from the plate body,
wherein the body is divided into a first portion and a second portion sharing the first surface, the terminal set and the limiting portion are located at the first portion and the first portion is located in the casing, and the second portion is extended from the first portion to outside of the casing and propped against the bearing surface.

15. The storage device of claim 14, wherein a gap is provided between the interfering portion and the plate body.

16. The storage device of claim 1, wherein the terminal set is a transmitting interface with four-wire differential transmission.

17. The storage device of claim 16, wherein the terminal set is a transmitting interface with two-wire differential transmission.

18. The storage device of claim 17, wherein the terminal set is a Universal Serial Bus (USB3.0) terminal set.

19. The storage device of claim 1, wherein the body is entirely packaged by system in package (SIP) technology.

20. The storage device of claim 5, wherein the bearing member comprises a plate body that the interfering portion and the pair of fourth assembling portions are respectively extended from the plate body, and the interfering portion is located between the pair of fourth assembling portions,
    wherein an external distance between the pair of fourth assembling portions is greater than an external distance between the pair of side plates when the interfering portion is accommodated in the casing.

\* \* \* \* \*